United States Patent [19]

Smith, III

[11] Patent Number: 4,670,888

[45] Date of Patent: Jun. 2, 1987

[54] FREQUENCY MODULATED MODEM TRANSMITTER

[75] Inventor: William N. Smith, III, Carrollton, Tex.

[73] Assignee: Agile Systems, Inc., Carrollton, Tex.

[21] Appl. No.: 796,007

[22] Filed: Nov. 7, 1985

[51] Int. Cl.[4] ............................................. H03C 3/09
[52] U.S. Cl. ..................................... 375/62; 455/113; 331/1 R; 332/19
[58] Field of Search ...................... 375/45, 62, 65, 120; 331/10, 23, 179, 1 R, 1 A; 332/16 R, 19; 455/112, 113

[56] References Cited

U.S. PATENT DOCUMENTS

| | | | |
|---|---|---|---|
| 4,068,199 | 1/1978 | Madoff | 375/65 |
| 4,471,328 | 9/1984 | Chapman | 375/62 |
| 4,481,489 | 11/1984 | Kurby | 375/120 |
| 4,567,603 | 1/1986 | Howell et al. | 375/65 |

OTHER PUBLICATIONS

Millman & Halkias, *Integrated Electronics: Analog and Digital Circuits and Systems*, McGraw-Hill, 1972, pp. 636-647.

Primary Examiner—Benedict V. Safourek
Attorney, Agent, or Firm—Hubbard, Thurman, Turner & Tucker

[57] ABSTRACT

A frequency modulated transmitter including a reference frequency source providing a reference frequency to a phase locked loop circuit. The phase locked loop circuit provides a frequency output signal stabilized in accordance with this reference frequency and in accordance with a feedback signal. The phase locked loop circuit further includes a data input circuit that adjusts the output frequency in accordance with input data. Also included is the feedback circuit that provides the feedback signal to the phase locked loop circuit. This feedback circuit is derived from the frequency output signal. A synchronization circuit is connected to the feed back circuit and synchronizes the output of the feedback circuit with the reference frequency signal and the input data.

2 Claims, 5 Drawing Figures

FREQUENCY MODULATED MODEM TRANSMITTER

BACKGROUND

1. Field of the Invention

This invention is related to radio frequency transmitters and specifically to transmitters of frequency modulated signals.

2. Description of Related Information

Radio frequency transmitters have traditionally used high frequency carrier signals that are modulated to superimpose information upon the signals and then transmitted to a receiver which demodulates the signal to remove the transferred information. One technique of producing such a carrier signal involves a crystal controlled oscillator whose base frequency signal output is input into a frequency multiplier network. The frequency multiplier multiplies the base frequency from the crystal oscillator circuit to produce an output frequency which is a predetermined multiple of the base frequency. One disadvantage to this technique is that filters must be used to filter out the harmonic signals and spurious signals produced by the multiplier circuits. Therefore, the transmitter circuit must include several multipliers, filters and amplifiers in series to produce the high frequency carrier signal. Each of these stages must be tuned in order to produce the desired output carrier frequency. A transmitter for producing an output carrier frequency in the order of 200 MHz may require twenty to thirty separate adjustments to properly produce the appropriate output frequency. Even then, the output frequency is fixed for a specific center frequency and to adjust the transmitter to produce a different output frequency, one must change the crystal oscillator output frequency and retune the other circuit elements.

A second technique for producing a frequency variable output transmitter involves using the same first transmitter technique and a second circuit involving a phase locked loop. The output of the first technique transmitter and the phase locked loop are combined in a mixer circuit which provides an output signal frequency that is the sum and the difference of the two input frequency signals. By placing a filter on the output of the mixer, one may select the desired frequency. The phase locked loop circuit produces an output frequency in a manner that can be varied. Specifically, the phase locked loop system includes a feedback loop component which may be adjusted to change the resulting output frequency from the phase locked loop. Therefore, by adjusting this feedback component, the resulting output from the mixer may be altered. The disadvantage to this second technique is that the mixer is a non-linear element which restricts the output frequency to a limited range. Further, the first technique transmitter circuit still requires the many adjustments previously discussed.

A third technique is to use a phase locked loop circuit by itself and modulate the phase locked loop output with the information data as an input. Specifically, the phase locked loop includes a crystal frequency oscillator to provide a reference frequency that is input to a phase detector that receives a feedback signal along with the reference frequency signal. The phase detector output is a pulse signal which is input to an integrator circuit. The output of the integrator circuit is connected to a summing node which also receives the input data. The summing node is connected to a varactor which is connected in series with a voltage controlled oscillator. The varactor operates as a voltage controlled capacitor to supply a signal voltage to the voltage controlled oscillator which outputs a frequency in accordance with the voltage input. The output of the voltage controlled oscillator is input to a buffer amplifier for transmission of the frequency output signal. The output of the voltage controlled oscillator is also input to a feedback element, normally, a divide by circuit used to divide the frequency down to a certain level for feedback to the phase detector circuit. A counter is customarily connected to the divide by circuit which specifies the number that the frequency from the voltage controlled oscillator is divided by to derive the feedback signal input to the phase detector. The feedback signal is compared to the reference frequency to close the loop and to maintain the output frequency control at a constant value. By varying the magnitude of the number in the counter, the output frequency of the circuit may be controlled and varied. One disadvantage of this technique is that this technique is not practical for input signals having a duty cycle less than 50%. Specifically, with a data input duty cycle different than 50%, the frequency output varies between an upper and lower limit with a center frequency skewed toward one of those limits. In a frequency modulated transmitter, it is desired that the center frequency be in the center of the upper and lower limits. By having the center frequency skewed to one side, i.e., toward one of the limits, a heavy burden is placed on the receiver to demodulate or discriminate the lower limit.

Techniques that have been used to overcome this center frequency dilemma include the specification of data protocols, such as SDLC or Manchester encoding. These protocol restrictions require that the data signals transition in accordance with the rules of the protocol to, effectively, alter their duty cycle to approach the desired 50% level.

It is therefore desired to produce a frequency modulated transmitter that is protocol independent and is responsive to both DC and AC data signals. Further desired is a system that is low cost, requires no adjustment, has no harmonic or spurious output and is frequency agile over a wide frequency range such as 100 MHz.

It is the object of the present invention to provide a frequency modulated transmitter that is protocol independent, low cost, requiring few if any adjustments, produces extremely small harmonic or spurious outputs, is responsive to both DC and AC up to approximately 200 KHz and is agile over a frequency range of approximately 100 MHz.

SUMMARY OF THE INVENTION

In accordance with the present invention, a frequency modulated transmitter is provided that includes a reference frequency source connected to a phase locked loop circuit that provides a frequency output signal stabilized in accordance with the reference frequency source. The phase locked looped circuit includes a data input circuit that adjusts the output frequency signal in accordance with input data. The phase locked loop circuit also includes a feedback circuit that adjusts that frequency output signal in accordance with a feedback signal derived from the output of the phase locked loop. The phase locked loop circuit further includes a synchronization circuit that is connected to the feedback circuit to synchronize the feedback circuit output with both the reference frequency source and the input data.

In one embodiment of the present invention, a frequency modulated transmitter is disclosed and includes a reference frequency source connected to a phase detector circuit. The phase detector circuit provides an output in response to the reference frequency source and a feedback signal. The phase detector output is input to an integrator circuit and provides an output signal representing an integration of the phase detector output signal. The output of the integrator circuit is connected to the summing node which is further connected to receive input data. A voltage controlled oscillator is connected to the summing node and provides a frequency output signal in accordance with the voltage from the summing node and ground. A synchronizer circuit is connected to receive the data and is further connected to the reference frequency source. The synchronizer circuit provides a synchronization signal. A divider circuit is included that is connected to the output of the voltage control oscillator and further connected to receive the synchronization signal from the synchronizer circuit. The divider circuit provides the feedback signal to the phase detector wherein the feedback signal derived from the voltage controlled oscillator output signal is synchronized in accordance with the reference frequency source and the data.

In a further embodiment of this invention, the synchronization circuit includes a flipflop that is connected to receive data from a data input line and is clocked by the reference frequency source. The output of this flipflop is connected to first and second latches. The output of the first latch is directly connected to the output of the flipflop and the output of the second latch is connected to a complement of the output of the flipflop. The latches include outputs that are connected to the divider circuit.

BRIEF DESCRIPTION OF THE DRAWINGS

The novel features believed characteristic of the invention are set forth in the claims. The invention itself, however, as well as other features and advantages thereof, will be best understood by reference to a detailed description of the preferred embodiment when read in conjunction with the accompanying drawings wherein:

DETAILED DESCRIPTION OF THE PREFERRED EMBODIMENT

Figure 1:
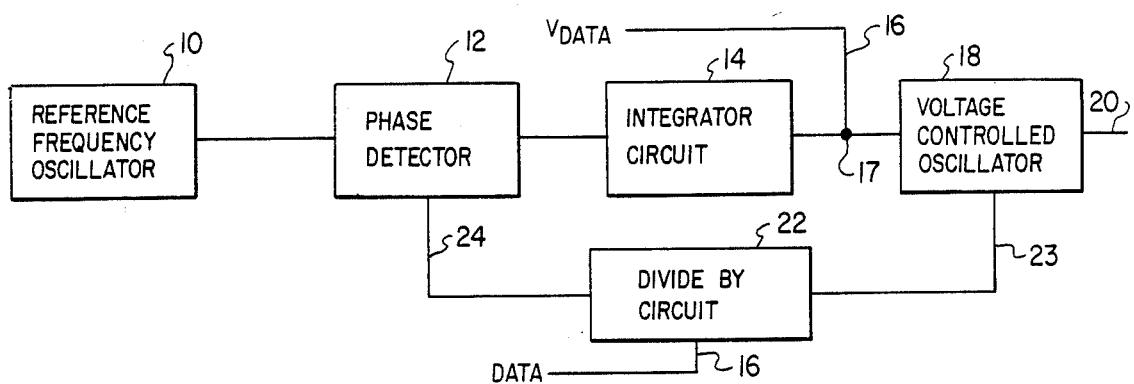
FIG. 1 is a block diagram of a prior art frequency synthesizer circuit.

The purpose of this invention is to produce a transmitter circuit having a variable output frequency. The embodiment of this invention is in a frequency modulated MODEM transmitter circuit. To properly understand the prior art, FIG. 1 has been included. FIG. 1 is a block diagram of a prior circuit used as a frequency synthesizer. This circuit includes a reference frequency oscillator 10 which commonly comprises a crystal controlled oscillator. The oscillator 10 output, a reference frequency, is coupled to a phase detector circuit 12. The phase detector circuit 12 also receives a feedback signal on line 24. The output of the phase detector 12 is commonly a series of pulses representing the reference frequency and are adjusted by the feedback signal. The output of the phase detector circuit is coupled to an integrator circuit 14. The output of the integrator circuit is connected to a summing node 17 which also receives input data on line 16. Since the output of the integrator circuit 14 is a voltage and the input on line 16 is a voltage, the voltage on node 17 (across node 17 to ground) provides the input to the voltage controlled oscillator 18 that designates the output frequency of this voltage controlled oscillator 18. This output is provided on line 20 as the frequency signal output of the circuit. In addition, this output frequency is provided on line 23 to a divide by circuit 22 to provide a feedback signal on line 24 to the phase detector 12. The divide by circuit 22 includes a data input on line 16 which controls the divide by circuit 22 in a manner to control the feedback signal on line 24. This prior art is discussed in greater detail in two articles entitled "RF MODEMS - Part I and Part II" that appeared in *RF Design* in the September/October and November/December, 1985 issues. These articles are herein incorporated by reference.

The disadvantage of the circuit is that it is data duty cycle and data rate limited and spectrum inefficient. Specifically, the frequency output of such a circuit is variable by steps of units corresponding to the integer input to the divide by circuit 22. In the embodiment discussed in the "RF MODEM" articles, the least significant bit of the data is input on line 16 to control the divide by circuit 22. As disclosed, this step has to be equal to the sample rate frequency. It is advisable to use a data rate that is less than this sample frequency rate. Therefore, a high data rate will require an even higher sample frequency and since the frequency centers for adjacent channels are equivalent to the sample frequency the pad width requirement will be unnecessarily large for a given data rate.

The present invention is embodied in a frequency modulated MODEM transmitter that operates independent of applied digital wave form duty cycle with respect to the output frequency. Furthermore, the data rate can be faster than the sampling frequency and thus, the data rate is independent of the sampling frequency. Still further, the resulting capability of this inventive circuit is that the data rate may be up to ten times faster then the prior circuit illustrated in FIG. 1.

Figure 2:
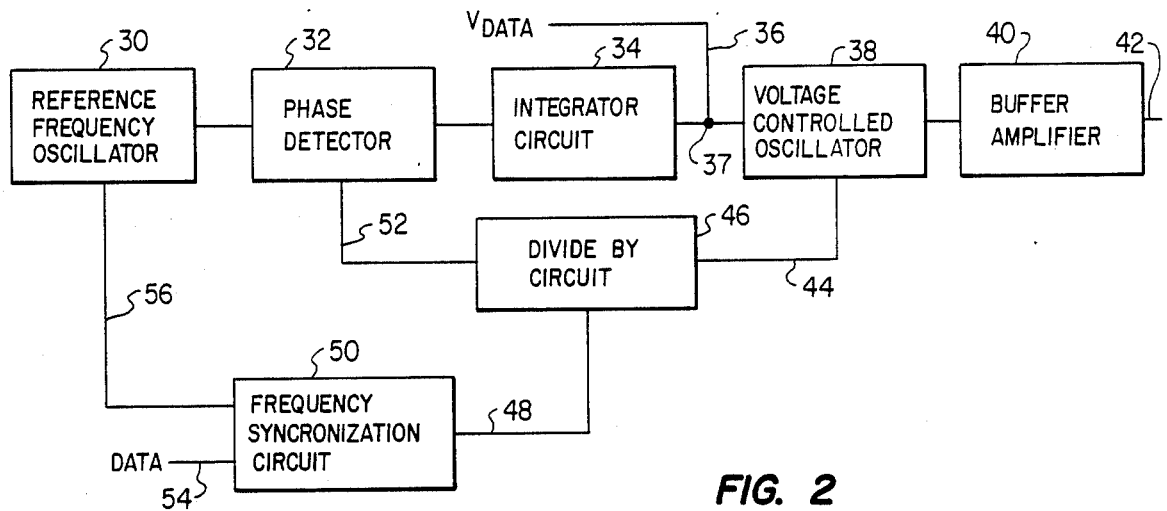
FIG. 2 is a block diagram of the invention including a phase locked loop frequency synthesizer circuit including a frequency synchronization circuit.

This embodiment of the invention is illustrated in block diagram form in FIG. 2. Specifically, a reference frequency oscillator 30 is provided to output a reference frequency to a phase detector circuit 32. This phase detector circuit 32 is also coupled to receive a feedback signal on line 52 and to provide an output to an integrator circuit 34. The integrator circuit 34 provides output to a summing node 37 which is also connected to data line 36. A voltage controlled oscillator 38 is connected to receive the voltage from the summing node 37 and a reference (ground). The voltage controlled oscillator 38 provides an output frequency signal to a buffer amplifier 40 which provides this output signal on line 42. A divide by circuit 46 is connected to the output of the voltage controlled oscillator 38 by line 44. Line 44 carries a frequency output from the voltage controlled oscillator 38 which is reduced in frequency by the divide by circuit 46. The output of the divide by circuit 46 is this reduced frequency which is provided to the phase detector circuit 32 as a feedback signal on line 52. The circuit of FIG. 2, including the reference frequency oscillator 30, the phase detector 32, the integrator circuit 34, the summing node 37, the voltage controlled oscillator circuit 38 and the divide by circuit 46 in the feedback loop, is similar to the prior art disclosed in FIG. 1. However, the divide by circuit 46 in the phase locked feedback loop section receives an input from a frequency synchronization circuit 50. The frequency synchronization circuit 50 is connected to receive the reference frequency on line 56 from the reference frequency oscillator 30 and further to receive data on line 54. The data on line 54 and the data on line 36 are the same.

Figure 3A:
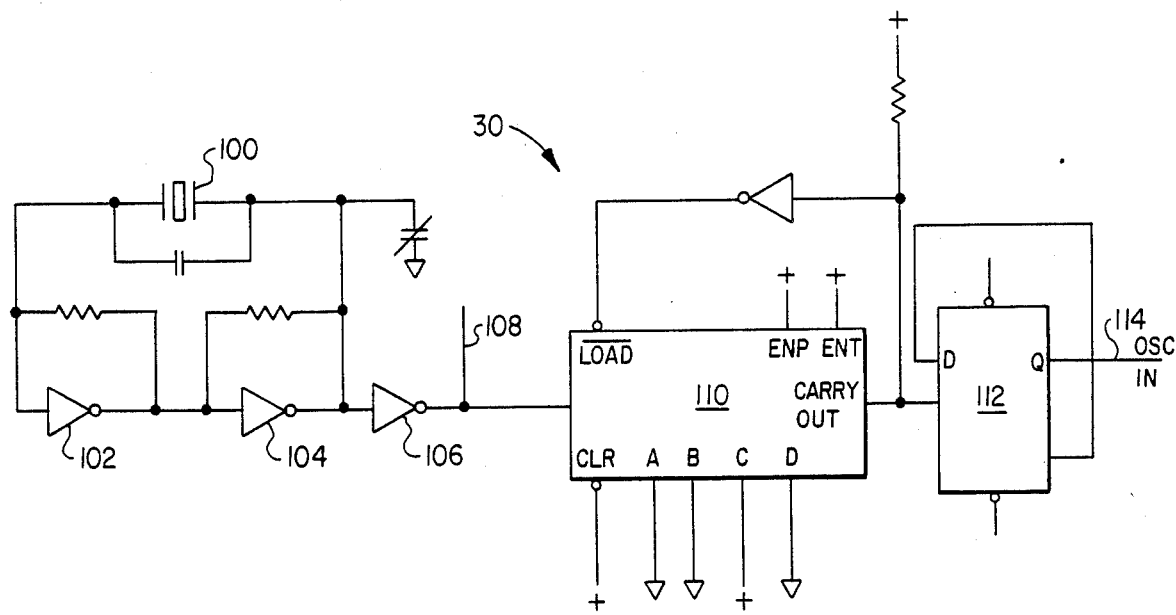
FIG. 3A is a schematic diagram of the reference frequency source circuit.

FIG. 3A illustrates the schematic diagram of the reference frequency oscillator 30. The circuit consists of a 3.2 MHz crystal 100 connected to two invertors 102 and 104 to provide an input to invertor 106. The output of invertor 106 is provided on line 108 which is a reference signal to be used by the frequency synchronization circuit 50. The output of invertor 106 is also provided to a divide by 12 counter 110 that is used to reduce the reference frequency output. The output of the divide by counter 110 is input through a D flipflop 112 to provide a square pulse output on line 114.

Figure 3B:
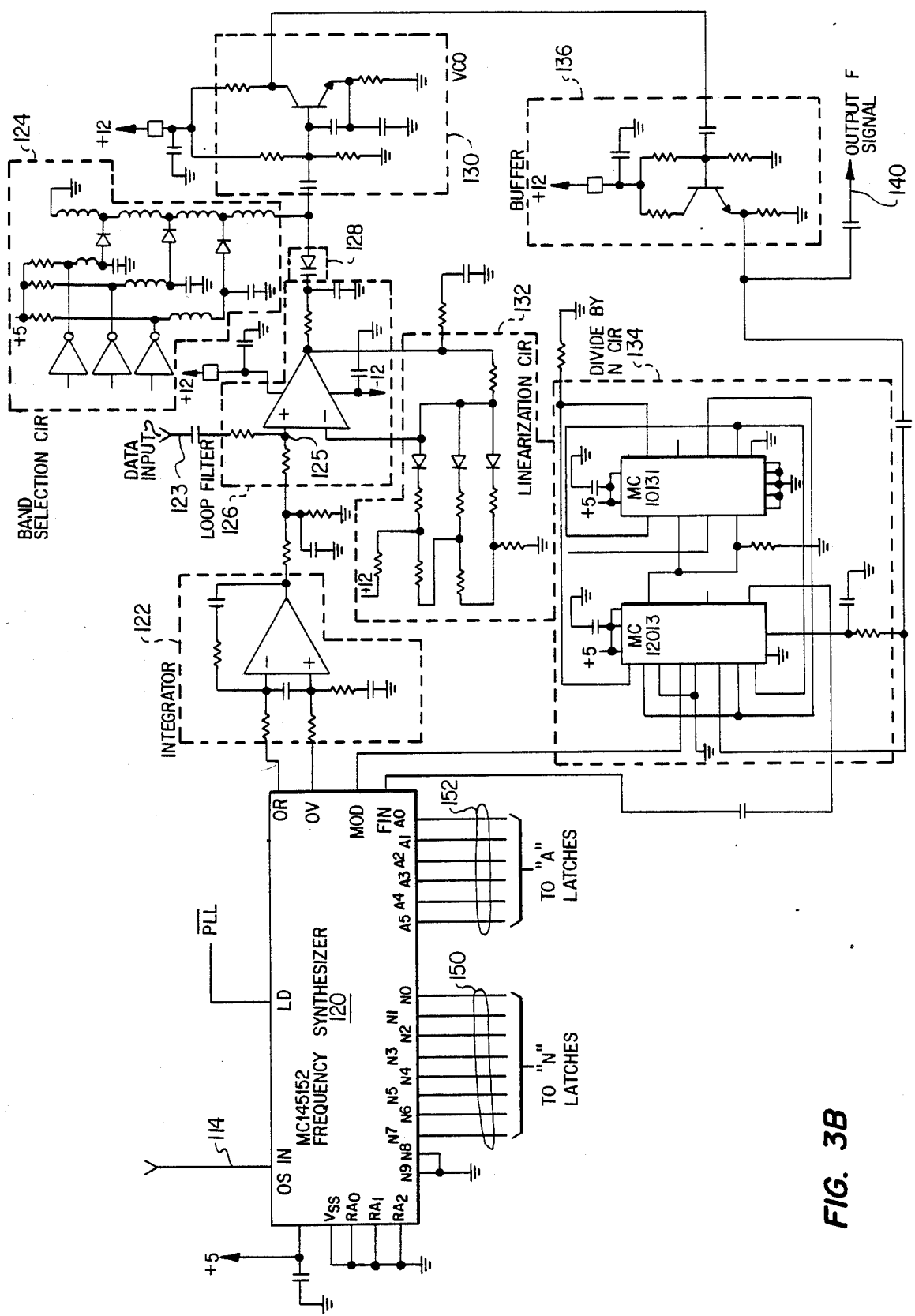
FIG. 3B is a schematic diagram of the phase locked loop frequency synthesizer circuit.

FIG. 3B is a schematic diagram of the phase locked loop portion of the FIG. 2. Specifically, the circuit includes a phase detector integrated circuit 120 that, in the preferred embodiment, is a Motorola MC 145152 Parallel Input Phase Locked Loop Frequency Synthesizer. The specification for this Motorola frequency synthesizer is herein incorporated by reference. The phase detector includes a reference frequency input on line 114 and is coupled to provide an output signal to the integrator circuit 122 as shown. The output of the integrator circuit is connected to a loop filter 126 in the preferred embodiment. An input into the loop filter 126 is the summing node 125 which is connected to the data line 123. The output of loop filter 126 is connected to a linearization circuit 132 to enhance the linearization characteristics of the frequency versus the voltage of the data input on line 123. The output of the loop filter 126 is also connected to a varactor diode 128 whose output provides a voltage input to the voltage controlled oscillator 130 designating the frequency output of the voltage control oscillator 130. In addition to the varactor 128 input, a band selection circuit 124 is provided as an input to the voltage controlled oscillator to enhance the tuning of the center frequency output of the circuit. The output of the voltage controlled oscillator is provided to a buffer amplifier 136 which amplifies the output frequency signal that is output on line 140. The buffer amplifier is further connected to a portion of the divide by circuit 134. It should be understood that the phase detector 120 that is being used in this embodiment also includes portions of the divide by counter circuitry internal to the chip. Therefore, the divide by circuitry 134 is combined with additional divide by circuitry in the integrated circuit 120 to perform the divide by function and provide the feedback signal as previously discussed. Additionally, the portion of the divide by end circuit that is included within the integrated circuit 120 is coupled to receive inputs 150 and 152 that are provided from the frequency synchronization circuit.

Figure 3C:
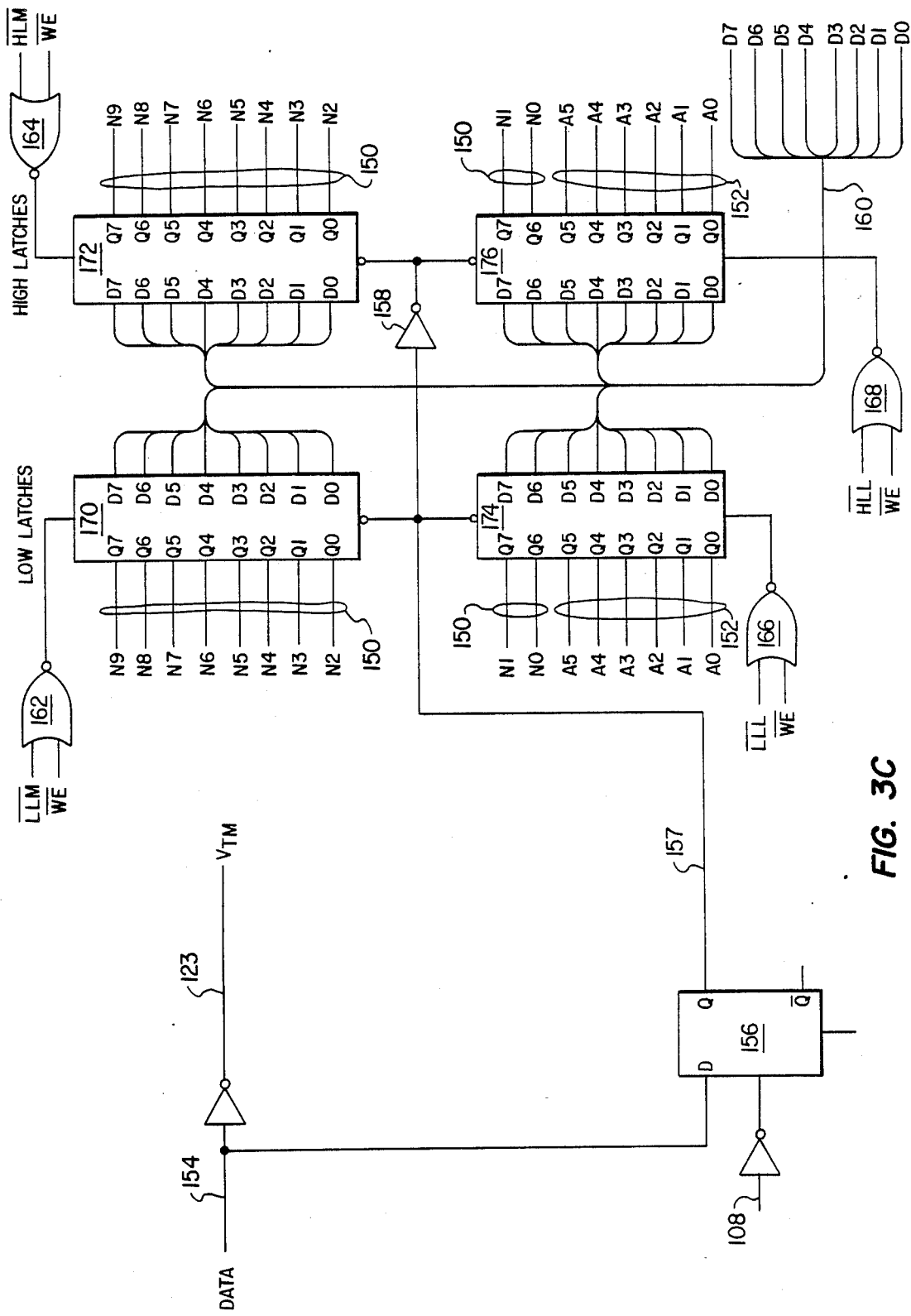
FIG. 3C is a schematic diagram of the synchronization circuit.

FIG. 3C is a schematic diagram of the frequency synchronization circuit. This circuit receives that data input on line 154 and provides the voltage data to line 123 as shown. The data on line 154 is further provided to a D flipflop 156 which is clocked by the 3.2 MHz frequency signal on line 108. The output of the D flipflop on line 157 is used to output enable one of two sets of latches. The first set of latches, latches 170 and 174, are enabled upon the positive output on line 157. Line 157 is connected to invertor 158 to enable the second set of latches 172 and 176 upon a low signal on line 157. The output of the first set of latches 170 and 174 is provided to the phase detector integrated circuit 120 (FIG. 3B) on lines 150 and 152. Likewise, the output of the second latches 172 and 176 is also provided on lines 150 and 152 to the phase detector integrated circuit 120 as shown. The data input to these latches 170, 172, 174 and 176 is provided on lines 160 and the input control logic 162, 164, 166 and 168 as shown.

The data on line 160 is the data to be loaded into the latches 170, 172, 174 and 176 and used as the divide by integers to specify the upper and lower limit of the output frequency. Control signals 162, 164, 166 and 168 are the input stroke signals for the latches 170, 172, 174 and 176.

The result of this addition of the frequency synchronization circuit is that the data used to adjust the output frequency of the transmitter is synchronized with the reference frequency input to the phase detector circuit. The additional capability resulting from this invention is that the data rate can be increased up to ten times faster than the sample frequency greatly enchancing the data capability of the FM transmitter and resulting in increased spectrum efficiency and duty cycle independence from DC to 200 KHz.

Although a preferred embodiment has been described in detail, it should be understood that various substitutions, alterations, and modifications may become apparent to those skilled in the art. These changes may be made without departing from the scope and spirit of this invention as defined by the appended claims.

I claim:

1. A frequency modulated transmitter comprising:
a reference frequency source connected to a phase locked loop circuit means for providing a frequency output signal stabilized in accordance with the reference frequency source, the phase locked loop circuit means including:
  (a) a data input circuit means for adjusting the frequency output signal in accordance with input data;
  (b) a feedback circuit means for adjusting the frequency output signal in accordance with a signal derived from the frequency output signal, wherein said feedback circuit means includes a divide by integer circuit for providing the derived signal by dividing the frequency output signal by a specific integer; and
  (c) a synchronization circuit means connected to the feedback circuit means for synchronizing the feedback circuit means with the reference frequency source and input data wherein the synchronization circuit means provides a signal to the feedback circuit means to provide the specified integer, and includes a flipflop connected to receive data from the data input and is clocked by the reference frequency source, and further includes first and second latches, the first latch connected to receive an output from the flipflop and the second latch connected to receive a complemented output from the flipflop, said latches connected to provide the integer information to the divide by integer circuit means.

2. A frequency modulated transmitter comprising:

a reference frequency source;

a phase detector means connected to the frequency source for providing an output in response to a feedback circuit;

an integrator circuit means connected to the phase detector means for providing an output signal representing an integration of the phase detector means output signal;

a summing node connected to a data input line and to the output of the integrator circuit means;

a voltage controlled oscillator for receiving an input from the summing node and for providing a frequency output signal;

a synchronization circuit means connected to said data input line and said reference frequency source for providing a synchronization signal;

a divider circuit means connected to the voltage controlled oscillator and the synchronization circuit means for providing the feedback control signal in accordance with data on the data input line and in synchronization with said reference frequency source; and wherein the synchronization circuit means further includes a flipflop connected to receive data from the data input line and clocked by the reference frequency source, and first and second latches, the first latch connected to receive an output from said flipflop and the second latch connected to receive a complemented output from the flipflop, the latches further connected to provide an output to the divider circuit means.

* * * * *